United States Patent [19]

Antonen

[11] Patent Number: 4,518,631

[45] Date of Patent: May 21, 1985

[54] THIXOTROPIC CURABLE COATING COMPOSITIONS

[75] Inventor: Robert C. Antonen, Midland, Mich.

[73] Assignee: Dow Corning Corporation, Midland, Mich.

[21] Appl. No.: 551,232

[22] Filed: Nov. 14, 1983

[51] Int. Cl.$^3$ .................. C08L 63/04; C08L 63/02
[52] U.S. Cl. ..................... 427/96; 427/386; 523/435
[58] Field of Search ............... 523/435; 524/863, 868, 524/777; 427/96, 386

[56] References Cited

U.S. PATENT DOCUMENTS

| | | | |
|---|---|---|---|
| 3,842,141 | 10/1974 | Fetscher et al. | 260/824 EP |
| 3,971,747 | 7/1976 | Bank et al. | 260/37 SB |
| 4,082,719 | 4/1978 | Liles et al. | 260/37 SB |
| 4,202,811 | 5/1980 | Michael et al. | 523/435 |

FOREIGN PATENT DOCUMENTS 56-136816  10/1981  Japan ................... 523/435

Primary Examiner—Lewis T. Jacobs
Attorney, Agent, or Firm—Robert Spector

[57] ABSTRACT

The degree of thixotropic character exhibited by curable compositions comprising specified epoxide reactants, organosilicon reactants and fillers can be varied by varying the weight ratio of epoxide reactant to organosilicon reactant between values represented by $r_1$ and $r_2$ wherein said values are within the range of from 1:1 to 8:1. The compositions are particularly useful as extrudable coatings for solid state electronic devices.

26 Claims, 3 Drawing Figures

THIXOTROPIC CURABLE COATING COMPOSITIONS

BACKGROUND OF THE INVENTION

1. Field of the Invention

This invention relates to curable coating compositions. More particularly, this invention relates to a class of thixotropic coating compositions containing at least one polyfunctional epoxide reactant and at least one organosilicon reactant. The amount of thixotropic character exhibited by the compositions, i.e. the extent to which they flow under zero shear, is controllable when the weight ratio of the two types of reactants is within specified limits. The compositions are particularly useful as extrudable coating compositions for solid state electronic devices.

2. Description of the Prior Art

Solid state electronic devices such as transistors and integrated circuits are typically very delicate and must be protected against physical damage and atmospheric moisture. Such protection is often achieved by encapsulating the device in a hard, chemically resistant material such as an epoxy resin or a copolymer of an epoxy resin and an organosilicon reactant.

One method for encapsulating electronic devices employs a technique known as transfer molding. The device is placed in a mold and a quantity of molten resin sufficient to fill the mold cavity is injected and allowed to solidify around the device, leaving the electrical connections or leads to the device exposed.

Transfer molding has a number of disadvantages, including the cost of encapsulating a number of different devices individually, prior to mounting them on a circuit board. In addition, it is sometimes difficult to achieve an adequate moisture proof seal around the leads which project through the encapsulating material and serve to connect the device to the circuit board. A more economically advantageous alternative to transfer molding is to mount a number of solid state devices on a circuit board and encapsulate the devices in a single operation. Because it is usually not practical to fabricate a mold to accommodate an entire circuit board, the composition used to encapsulate the devices should be sufficiently thixotropic that a coating can be applied by extruding the composition on to the device under relatively low pressure. Once in place the coating should flow only to the extent that it will form a smooth surface without otherwise altering its original contour. This property must be exhibited both at ambient temperature and the temperature at which the coating is cured, which can be up to 200° C.

The use of copolymers derived from polyfunctional epoxide and organosilicon reactants for encapsulating electronic devices is disclosed in the prior art. For example, U.S. Pat. No. 3,971,747, which issued to Bank and Michael on July 27, 1976, teaches that molding compositions suitable for encapsulating integrated circuits by transfer molding contain copolymers derived from a "phenylmethylsiloxane resin" and commercially available epoxy resins. The copolymers are prepared in the presence of specified aluminum-containing catalysts. U.S. Pat. No. 4,082,719, issued to Liles and Michael on Apr. 4, 1978, teaches that the addition of a small amount of an organosilicon material containing at least one silicon-bonded hydrogen atom per molecule to the reactants disclosed by Bank and Michael improves the performance of the epoxy-organosilicon copolymers as encapsulating materials for electronic devices. In particular, the tendency of water to "wick" up exposed leads of the devices is reduced.

U.S. Pat. No. 3,842,141, which issued on Oct. 15, 1974 to Fetscher and Sparapany discloses molding compositions prepared from a specified class of epoxyorganosilicon copolymers. The compositions exhibit desirable properties such as high volume resistivity, low water absorption and good hot strength, and are used to encapsulate integrated circuits by conventional molding techniques.

None of the aforementioned patents teach employing the disclosed copolymers or precursors thereof as ingredients of extrudable compositions that can be coated onto integrated circuits or other devices mounted on a circuit board at ambient temperature and subsequently cured without any substantial change in configuration of the initial coating.

It is known to impart thixotropy to liquid coating compositions by adding solid or liquid thixotropic agents such as cellulose esters, however this method has a number of disadvantages. In addition to increasing the raw material cost of the composition, the interaction of the thixotropic agent and the other ingredients of the composition may undesirably modify properties of the uncured or cured compositions. This interaction may be instantaneous or gradual and could result in a complete or partial loss of desirable properties, including thixotropy, during storage of the composition. Finally, any modification of the type or proportions of the ingredients, including reactants and filler, will usually require a change in the amount and/or type of thixotropic agent to achieve acceptable performance as a protective coating composition, i.e., a smooth surface with retention of initial coating configuration.

One objective of this invention is to provide thixotropic coating compositions containing epoxide and organosilicon reactants.

Another objective of this invention is to provide means for varying the degree of thixotropy exhibited by coating compositions containing epoxide and organosilicon reactants without the addition of conventional thixotropic agents or other modifiers.

SUMMARY OF THE INVENTION

The foregoing objectives can be achieved using combinations of certain known epoxide reactants and organosilicon reactants, with the proviso that the weight ratio of epoxide reactant to organosilicon reactant is maintained within the range of from 1:1 to 8:1.

The ability to control the amount of thixotropic character, i.e. the amount of flow-out, exhibited by the present compositions is unexpected, because in many instances the individual reactants are not thixotropic even in combination with the fillers employed in the compositions.

DESCRIPTION OF THE DRAWINGS

The accompanying drawings depict one acceptable and two unacceptable cured coatings obtained when curable liquid coating compositions exhibiting varying amounts of thixotropic character are extruded over a semiconductor device mounted on a printed circuit board. The semiconductor device (1), represented by a rectangular block, is adhered to a printed circuit board (2) in an area conventionally referred to as a "bonding pad." (3) Electrical connections between selected areas of the semiconductor device and conductors on the printed circuit board are made by means of fine connecting wires (4). To protect the semiconductor device and connecting wires against damage, the device is enclosed in a coating (5), which is shown in cross section.

Figure 2:
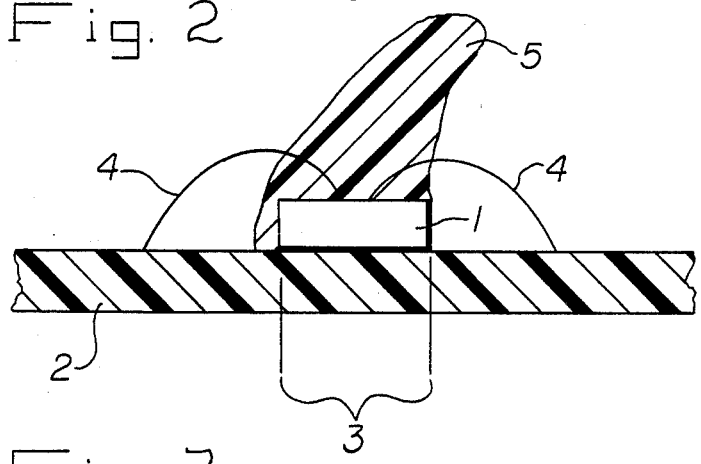

The coating illustrated in FIG. 2 did not flow sufficiently to completely enclose the semiconductor device and the connecting wires or to form a smooth surface on the coating.

Figure 3:
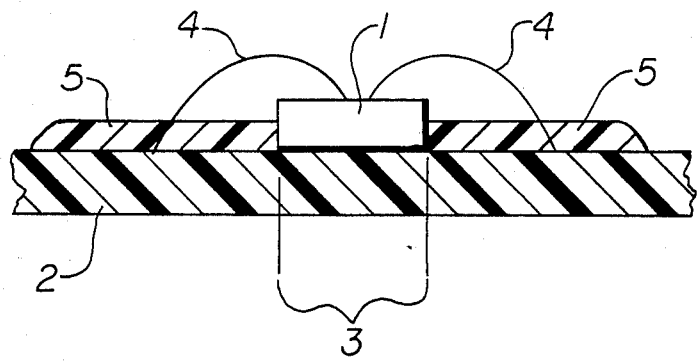

FIG. 3 illustrates a coating formed using a nonthixotropic liquid composition. The composition flowed well beyond the area of the bonding pad and connecting wires, leaving areas of the semiconductor device exposed.

DETAILED DESCRIPTION OF THE INVENTION

This invention provides curable coating compositions comprising a homogeneous mixture of (A) a polyfunctional liquid or solubilized epoxide reactant selected from the group consisting of cycloaliphatic epoxide compounds, glycidyl ethers of polyhydric phenols and epoxidized novolak resins; (B) a polyfunctional liquid or solubilized organosilicon reactant selected from the group consisting of silanes and polyorganosiloxanes, wherein each molecule of said organosilicon reactant contains at least two silicon-bonded groups selected from the group consisting of hydroxyl and alkoxy containing from 1 to 4 carbon atoms; (C) an amount of filler sufficient to impart a viscosity of from 50 to 1000 Pa·s, measured at 25° C., to said composition; and (D) a curing catalyst in an amount sufficient to promote curing of said composition. The degree of thixotropic character exhibited by said composition is a function of the weight ratio of said epoxide reactant to said organosilicon reactant, and exhibits a gradual variation from a maximum degree of thixotropic character at weight ratio value $r_1$ to a minimum degree of thixotropic character at weight ratio value $r_2$, the values represented by $r_1$ and $r_2$ being within the range from 1:1 to 8:1, inclusive.

This invention also provides a method for varying the amount of thixotropic character, i.e., the amount which the aforementioned coating compositions flow under zero shear, by varying the weight ratio of epoxide reactant to organosilicon reactant within the aforementioned range of from $r_1$ to $r_2$, inclusive.

Within the aforementioned range of weight ratios, i.e. from 1:1 to 8:1, the rheology, or flow properties, of the present compositions can be varied by changing the relative amounts of epoxide reactant and organosilicon reactant present in the composition. For each composition of this invention there is a range of weight ratios, which can be referred to as $r-r_1$, within which the composition exhibits maximum thixotropic character. When a composition within this range is placed on a horizontal surface in the form of a mound or other three-dimensional shaped article, that article will retain its original contour, including any surface irregularities, for an extended period of time, often until it cures. As the weight ratio of epoxide reactant to organosilicone reactant is varied from $r_1$ in a direction away from r, the flowability of the uncured composition will gradually increase. The first evidence of this phenomenon is that the surface of a three-dimensional article, such as the aforementioned mound, will flow sufficiently to smooth out surface irregularities, such as peaks and craters, without causing any significant alteration in the initial dimensions, such as height of the article. As the weight ratio of epoxide reacted to organosilicon reactant is gradually moved further away from the $r_1$ value, the degree of "flow-out" exhibited by the composition will gradually increase, with a corresponding increase in the difference between the initial and final height of a shaped article until, at a weight ratio value referred to herein as $r_2$, the thixotropic character of the composition decreases to the extent that the composition becomes completely self-leveling and forms a thin film unless confined in a mold or similar device.

The breadth and location of the aforementioned $r_1$-$r_2$ range of weight ratios within the present broad range of 1:1 to 8:1 and the direction in which the weight ratio should be varied from the aforementioned $r_1$ value to obtain a more flowable composition will depend upon the constituents of the particular composition. The $r_1$-$r_2$ range for a particular composition can be readily determined by one skilled in the art with a minimum of experimentation using the examples contained in this specification as guidelines.

(A) The Polyfunctional Epoxide Reactant

Polyfunctional epoxide reactants that can be combined with a filler, a curing catalyst, and from 0.125 to 1 times their weight of an organosilicon reactant to yield the curable, thixotropic compositions of this invention include glycidyl ethers of polyhydric phenols, epoxidized novolak resins (an art-accepted nomenclature for glycidyl ethers of phenol-aldehyde condensation products), and cycloaliphatic epoxides wherein both carbon atoms of at least one of the epoxide groups

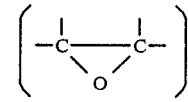

are part of a cycloaliphatic ring structure.

Representatives of all the aforementioned classes of epoxides are commercially available. Preferred embodiments of each class are disclosed in the accompanying examples.

Of the three classes of epoxide reactants suitable for use in the present compositions, diglycidyl ethers of di- and bis-phenols and epoxidized novolak resins are less reactive because they are considerably less reactive than the cycloaliphatic epoxides. Compositions containing the less reactive epoxide reactants have been shown to have substantially greater storage stability, i.e. the viscosity of these compositions increases less rapidly during storage relative to compositions containing cycloaliphatic epoxide reactants. The storage stability of coating compositions containing cycloaliphatic epoxide compounds can be increased by the addition of relatively small amounts of alkaline earth metal fatty acid salts such as calcium stearate. These stabilizers are typically present in amounts up to about 1%, based on the weight of the coating composition. These stabilizers and other optional ingredients are discussed in greater detail in a subsequent portion of this specification.

Depending upon the degree of polymerization, the diglycidyl ethers of dihydric, dinuclear phenols such as bis phenol A, i.e., 2,2-bis(4-hydroxyphenyl)propane, are liquids or solids at ambient temperature. To facilitate preparation of the present compositions, it is desirable that all reactants be liquids at ambient temperature. Even though they may be liquids initially, the moisture in the atmosphere may be sufficient to cause diglycidyl ethers of bis-phenols to gradually solidify, particularly in the presence of trace amounts of acidic or basic materials. It may therefore be preferable to employ one of the commercially available glycidyl ether type epoxide reactants that have been modified to inhibit spontaneous polymerization. Examples of modified glycidyl ethers of bisphenol A are Araldite® 6004, a product of Ciba-Geigy Corporation, Epi-Rez® 507, and Epi-Rez® 50834, products of Celanese Corporation.

Solid epoxide reactants can be used to prepare the compositions of this invention if they are present in solubilized form in the curable composition. Those solid epoxides reactants which are not soluble in the organosilicon reactant (B) should be present in combination with a liquid polyfunctional epoxide reactant that is a solvent for the solid reactant. Alternatively, a small amount of a liquid monofunctional epoxide compound, such as phenyl glycidyl ether, in which the solid reactant is soluble can be employed as a reactive diluent. Reactive diluents can constitute up to 20% by weight of the present coating compositions.

In some instances it may be necessary or desirable to include a nonreactive solvent to solubilize one or more solid reactants, achieve compatability among the various reactants or decrease the viscosity of a curable composition. In these instances up to 20%, based on the weight of the curable composition, of a nonreactive solvent can be incorporated into the present compositions. Useful solvents of this type include liquid hydrocarbons such as hexane, cyclohexane, benzene, and toluene, and ketones such as acetone and methylethyl ketone.

(B) The Organosilicon Reactant

Organosilanes and organosiloxanes containing at least two silicon-bonded hydroxyl or alkoxy groups per molecule can be employed singly or as mixtures to react with the epoxide reactant (A). Organosilanes can be represented by the general formula $R_mSi(OR')_{4-m}$, where R represents a hydrocarbyl or halohydrocarbyl radical, R' represents hydrogen or an alkyl radical, and m represents the integer 1 or 2.

Organosiloxanes are characterized by chains containing alternating silicon and oxygen atoms. Organosiloxanes can be cyclic or linear, contain from two up to several hundred silicon atoms per molecule, and are typically prepared by hydrolyzing organosilanes containing two or more hydrolyzable groups bonded to a silicon atom. Methods for preparing polyorganosiloxanes are well known and do not form part of this invention. When organosilicon reactant (B) is a polyorganosiloxane, it contains one or more types of repeating units of the general formula $$R_n''SiO_{\frac{4-n}{2}}$$

where R" is a hydrocarbyl or halohydrocarbyl radical and n has an average value of from 1 to 2, inclusive.

In the foregoing formulae the hydrocarbyl or halohydrocarbyl radicals represented by R and R" typically contain from 1 to 20 carbon atoms. The individual radicals represented by R and R" can be identical or different. Because organosilanes and organosiloxanes wherein R and R" are methyl, phenyl, vinyl, 3,3,3-trifluoropropyl or combinations thereof are readily available and impart properties which make them desirable for use in the present compositions, organosilicon reactants of these types are preferred. For the same reason, if the organosilicon reactant is an organosilane, R' is preferably hydrogen or methyl.

If it is desired the epoxide reactant and organosilicon reactant be mutually compatible, at least 50% of the R or R" radicals should be phenyl. Compatibility of the reactants is desirable because it will improve both the reactivity of the composition during curing and the adhesion of the cured coating to the substrate.

Preferred polyorganosiloxanes include liquid polydiorganosiloxanes, such as polydimethylsiloxanes, and polymethylphenylsiloxanes containing terminal hydroxyl or alkoxy groups. Polymethylphenylsiloxanes containing an average of from 2 to 5 repeating units per molecule are particularly preferred because they are compatible with the other ingredients of the curable compositions and impart greater adhesion and hardness to the cured coating when compared to other organosilicon reactants.

The characterizing feature of the present compositions is the ability to change the degree of thixotropy by varying the weight ratio of epoxide reactant (A) to organosilicon reactant (B) when this weight ratio is within the range of from 1:1 to 8:1. Within this range the thixotropy exhibited by the present compositions can be varied to obtain a rheology appropriate for a particular application.

When employed as coatings for electronic devices, the optimum level of thixotropy is one which allows the composition to be extruded under relatively low pressure onto a substantially horizontal surface to form a three-dimensional structure, such as a dome-shaped mound, that will retain its initial dimensions until fully cured. The degree of flow should be limited to that required to form a smooth exterior surface that is substantially free of irregularities such as peaks and craters.

As the weight ratio of the reactants is varied from the aforementioned optimum value, the degree of thixotropy gradually increases or decreases. At one extreme of the range an unconfined composition flows out to form a thin film rather than the desired three-dimensional structure. At the other end of the range, the surface of the three dimensional structure will not flow sufficiently to smooth out surface irregularities as described hereinabove for preferred embodiments.

(C) The Filler

Any of the fillers conventionally employed to reduce thermal expansion, and impart hardness, strength, and other desirable properties to cured coatings can be present in the coating composition of this invention.

The fillers can be of the reinforcing or extending type. Reinforcing fillers are preferably treated or untreated silica in a finely divided form and include fume silica in addition to aerogels, xerogels, and precipitated silicas.

Reinforcing fillers can optionally be treated with any of the conventional organosilicon treating agents that are well known in the art. Typical treating agents include organosilanes, organosiloxanes, and organosilazanes.

Examples of extending fillers include ground silica, aluminum oxide, aluminum silicate, zirconium silicate, magnesium oxide, zinc oxide, talc, diatomaceous earth, iron oxide, calcium carbonate, clays, titanium dioxide, zirconia, mica, glass, sand, carbon black, graphite, barium sulfate, zinc sulfate, wood, flour, cork and finely divided fluorocarbon polymers, among others.

Ground fused silica is a preferred extending filler for use in the compositions of this invention. A particularly preferred type of fused silica exhibits a maximum particle size of 44 microns.

The amount of filler should be sufficient to impart a viscosity of from 50 to 1000 Pa·s to the composition. Depending upon the viscosity of the epoxide and organosilicon reactant, the filler typically constitutes from 30 to 75% by weight, preferably from 50 to 70% by weight, of the present curable compositions.

The viscosities of coating compositions are often measured in terms of the torque required to rotate a disc or spindle at a given rate of speed in the composition at a given temperature. Because the present compositions exhibit varying degrees of thixotropic character, the viscosity measurements used to determine filler content are performed using relatively low rates of shear, such as those produced by rotating a viscometer spindle at a rate of from one to about five revolutions per minute at a temperature of 25° C. Under these conditions, preferred compositions exhibit viscosities of from about 300 to about 1,000 Pa·s (D) The Curing Catalyst The present compositions can be cured using any of the catalysts taught in the art for curing epoxy-silicone copolymers. A preferred class of catalysts are the aluminum compounds disclosed in the aforementioned U.S. Pat. No. 3,971,747 to Bank and Michael. This patent is hereby incorporated in its entirety by reference as a teaching of preferred curing catalysts. The catalysts of Bank et al. include aluminum alkoxides, aluminum carboxylates and reaction products of (1) these alkoxides or carboxylates with (2) organosilicon compounds containing silicon-bonded hydroxyl groups or silicon-bonded hydrolyzable groups such as halogen and alkoxy.

Aluminum carboxylates, including aluminum benzoate, are particularly preferred as curing catalysts because they are relatively active compared to other aluminum catalysts and are compatible with the ingredients of the curable composition. The preferred aluminum catalysts are effective at levels from 0.05 to 5% based on the combined weight of all reactants. Amounts greater than about 5% by weight will usually not appreciably increase the reaction rate above what is achieved at lower catalyst concentrations, and serve no useful purpose. The optimum catalyst concentration is a function of a number of variables including types of reactants and curing temperature.

(E) Optional Ingredients

The present compositions can contain conventional additives for silicone or epoxide resin coating compositions, including plasticizers, processing aids, additives to modify the curing reaction, fire retardants, and pigments.

The curable compositions of this invention preferably include a relatively small amount of at least one silane or siloxane containing at least one silicon-bonded hydrogen atom per molecule. U.S. Pat. No. 4,082,719, which issued to Liles and Michael on Apr. 4, 1978, teaches that the presence of this type of organosilicon material in a curable silicone-epoxy coating composition applied to an electronic device decreases the tendency of atmospheric moisture to penetrate the cured coating by "wicking" up the conductors which project through the coating and provide electrical connections to the device.

Reactants containing silicon-bonded hydrogen atoms are typically present at concentrations of from 0.005 to 0.5%, based on the combined weight of all organosilicon reactants and epoxide reactants.

Materials which inactivate the curing catalyst or otherwise adversely affect the curing reaction, such as significant quantities of certain amines, should be excluded from the present compositions.

As disclosed hereinbefore, if the epoxide reactant includes a cycloaliphatic type epoxide compound, to inhibit the significant increase in viscosity that often occurs shortly after these epoxides contact other ingredients of the present compositions, including fillers, it may be desirable to include from 0.01 up to about 1%, based on the total weight of the composition, of an alkaline earth metal salt of an aliphatic carboxylic acid containing from about 10 to about 20 carbon atoms as a viscosity stabilizer. Calcium stearate is a preferred viscosity stabilizer because it is readily available and compatible with the present compositions.

It is known that fatty acid salts exhibit lubricating properties which may alter the rheology of polymer compositions. It may therefore be necessary to adjust the weight ratio of epoxide reactant to organosilicon reactant to achieve the same thixotropy following addition of calcium stearate or other viscosity stabilizers.

(F) Preparation and Curing of Coating Compositions

The curable compositions of this invention can be prepared using any of the known methods and equipment for preparing homogeneous liquid coating compositions. If solid reactants are employed, these are preferably dissolved in a monofunctional or polyfunctional reactive solvent or a nonreactive solvent before being combined with the reactants, filler, catalyst, and any other optional ingredients. As previously disclosed, up to 20%, based on the total weight of the composition of a reactive or nonreactive solvent can be included in the present composition.

If it is desired to package the ingredients of the present compositions in separate containers to avoid premature curing or a significant increase in viscosity, the epoxide reactant and organosilicon reactant should be packaged separately. The catalyst is typically included together with the organosilicon reactant, particularly if the epoxide reactant is of the cycloaliphatic type. Distribution of the filler and any optional ingredients between the epoxide and organosilicon reactants is usually not critical. It has been found that if an organosilicon reactant containing silicon-bonded hydrogen atoms is present, the relative concentration of this reactant is sufficiently low that it can be included with the epoxide reactant without adversely affecting the storage stability of this reactant.

As discussed hereinabove, the controllable thixotropy exhibited by the present compositions make them particularly suitable for use as protective coatings which are applied by extrusion or other means onto selected areas of printed circuit boards containing integrated circuits, transistors or other delicate solid state electronic devices. These devices are typically formed by etching wafers of silicon or other semiconductive material and subsequently mounting the wafer or "chip" on a printed circuit board in an area referred to as a "bonding pad." Fine wires provide the electrical connections between conductors on the printed circuit board and selected areas on the chip.

When the compositions of this invention have been formulated and placed in position, they are cured. Depending upon the type of reactants, curing time and catalyst concentration, the curing temperature can be from ambient up to 200° C. Preferred compositions cure in from several minutes to two hours at temperatures of from 100° to 200° C.

The following examples disclose preferred compositions and demonstrate the controllable thixotropy that can be achieved when the ratio of reactants is maintained within the limits of this invention. The examples are not intended to limit the scope of the invention as described in the accompanying claims. All parts and percentages are by weight unless otherwise specified.

EXAMPLE 1

This example demonstrates the variation in thixotropy that can be achieved using a composition wherein the epoxide reactant is a diglycidyl ether of bis-phenol A.

One portion (I) of a two-part coating composition was prepared by combining 42 parts of a modified liquid diglycidyl ether of bis-phenol A, available as Araldite$^{(R)}$ 6004 from the Ciba-Geigy Corporation; 57.5 parts of a wet ground fused silica exhibiting a maximum particle size of 44 microns, and 0.5 part of a trimethylsiloxy endblocked polymethylhydrogensiloxane containing 1.6% by weight of silicon-bonded hydrogen atoms. The mixture was stirred for 2 minutes, at which time it was thixotropic (viscosity=1560 Pa·s, thixotropy index 3.89). After being stirred for an additional hour and remaining under ambient conditions for about 16 hours, the composition exhibited a viscosity of 400 Pa·s. The viscosities were measured using a Brookfield viscometer equipped with a number 7 spindle rotating at 1 revolution per minute. The composition was only slightly thixotropic (thixotropy index=1.45). Following an additional hour of stirring, the composition was no longer thixotropic.

The thixotropy indeces of compositions described in this and the following examples were determined using a rotating spindle type viscometer (Brookfield Model HAF) equipped with a number 6 or 7 spindle. The thixotropy index was obtained by dividing the viscosity reading obtained at a spindle speed of 1 r.p.m. by the value obtained using the same spindle rotating at a speed of 10 r.p.m.

The second portion (II) of the two-part composition was prepared by combining 8 parts of a hydroxyl endblocked polymethylphenylsiloxane containing an average of from 2 to 3 siloxane units per molecule with 12 parts of the aforementioned wet ground silica. The resultant mixture was stirred for about 5 minutes, at which time 0.06 part of aluminum benzoate was added and stirring continued for 10 minutes. An additional 4.9 parts of ground silica were then added and the mixture stirred for 20 minutes. The final composition exhibited a viscosity of 272 Pa·s at 25° C. using a number 6 spindle rotating at 1 r.p.m.

Both of the aforementioned portions (I and II) of the coating composition were stored for about 2 months under ambient conditions. At this time, neither composition was thixotropic. The compositions were combined to obtain weight ratios of I/II equal to 1/1, 2/1 and 3/1. This is equivalent to weight ratios of epoxide reactant to organosilicon reactant of 1.29, 2.55 and 3.76 respectively. About ½ gram of each of the resultant compositions was extruded to form a mound that at least initially covered a bonding pad area of a printed circuit board. The board was exposed to ambient conditions for between 20 and 30 minutes and then placed in a circulating air oven for 30 minutes to cure the coating. The oven temperature was 175° C.

Figure 1:
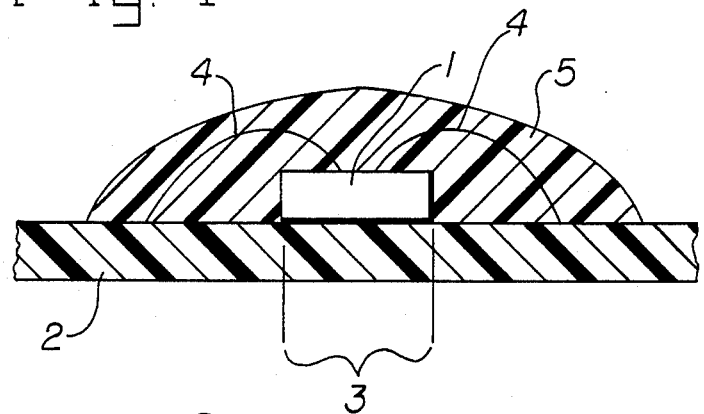
FIG. 1 depicts an acceptable coating, which completely covers the device and connecting wires, has a smooth surface and does not extend substantially beyond the area of the bonding pad and connecting wires.

The amounts of thixotropic character exhibited by the three coating compositions were rated subjectively by observing the contour of the cured coating and the surface area of the board covered by the coating. Acceptable coatings formed a smooth-surfaced mound of from 0.13 to 0.25 inch (33 to 64 mm) in height and resembled the coating depicted in FIG. 1 of the accompanying drawings.

Compositions which did not flow sufficiently to cover the area encompassed by the bonding pad and connecting wires and/or did not exhibit a smooth surface resembled the coating depicted in FIG. 2 of the accompanying drawings and were rated "very thixotropic."

Compositions which flowed to the extent that the cured coating was less than 0.13 inch (33 mm) thick formed coatings resembling the one depicted in FIG. 3 of the accompanying drawings and were rated "nonthixotropic." This type of coating is undesirable because it flowed well beyond the area of the bonding pad and associated connecting wires and would have exposed at least a portion of the semiconductor device and its connecting wires, which the coating was intended to protect.

Of the three compositions tested, only the 1/1 ratio of I/II was considered acceptable and sufficiently thixotropic for use as a coating composition. The cured coating adhered to the printed circuit board.

The 2/1 ratio of I/II (weight ratio of epoxide to organosilicon reactant=2.55) was less thixotropic, i.e., exhibited greater flow at ambient temperature under zero shear, than the 1/1 ratio composition. The mound of uncured material covered the bonding pad area, but was lower in height than the 1/1 ratio composition. The 3/1 ratio composition was rated "nonthixotropic." All of the aforementioned compositions could be cured by heating them for several minutes at 175° C.

EXAMPLE 2

This example demonstrates the variation in thixotropy that can be achieved with compositions containing a cycloaliphatic epoxide reactant.

The samples evaluated (A, B and C) contained an epoxide reactant of the formula

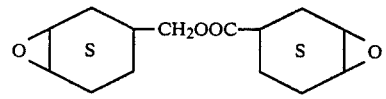

and the hydroxyl endblocked polymethylphenylsiloxane of Example 1 as the organosilicon reactant. The weight ratio of epoxide reactant to organosilicon reactant was 1/1 in Sample A, 2.6/1 in Sample B and 4.5/1 in Sample C. The samples were prepared by combining two mixtures (III and IV) in a weight ratio of 10:1, respectively. The ingredients of these mixtures are listed in the following Table 1. Compositions B and C were prepared by combining mixtures III and IV on the same day the mixtures were prepared. Mixture IV of Sample A was prepared 17 days before mixture III was prepared and combined with it to form Sample A. All samples were evaluated for thixotropy on the day they were prepared using the procedure and criteria described in the preceeding Example 1. Each mixture III contained 3-glycidoxypropyltrimethoxysilane (referred to as "silane") as an adhesion promoter. The use of functionally substituted trialkoxysilanes for this purpose is known in the art.

In the following Table 1, siloxane 1 is the hydroxyl-endblocked polymethylphenylsiloxane referred to hereinabove, siloxane 2 is the trimethylsiloxy endblocked polymethylhydrogensiloxane of Example 1, and the fused silica and catalyst are the same materials described in Example 1.

TABLE 1

| Ingredient | Sample A | Sample B | Sample C |
|---|---|---|---|
| Mixture III (10 parts) | | | |
| Epoxide | 18.3 | 27.3 | 31.3 |
| Siloxane 1 | 18.3 | 11.7 | 7.8 |
| Siloxane 2 | 0.25 | 0.25 | 0.25 |
| Fused Silica | 62.2 | 59.8 | 60.6 |
| Silane | 0.2 | 0.2 | 0.2 |
| Fume Silica | 0.75 | 0.75 | 0 |
| Mixture IV (1 part) | | | |
| Epoxide | 35.8 | 37.0 | 37.0 |
| Ground Silica | 63.0 | 62.0 | 62.0 |
| Silane | 0.1 | 0 | 0 |
| Catalyst | 1.0 | 0.3 | 0.5 |
| Fume Silica | 0 | 0.75 | 0.75 |
| Epoxide/Organosilicon Weight Ratio | 1.2 | 2.65 | 4.5 |
| Thixotropy | Very Thixotropic | Thixotropic | Nonthixotropic (Excessive flow) |

Sample A was excessively thixotropic and did not flow sufficiently to form an acceptable cured coating. Sample B formed a smooth-surfaced mound of sufficient height to have adequately protected a semiconductor device adhered to the bonding pad and the associated connecting wires. Sample C was rated nonthixotropic because it flowed beyond the area of the bonding pad and would, in all likelihood, have exposed at least a portion of a semiconductor device adhered to the bonding pad. The coating resembled the one depicted in FIG. 3 of the accompanying drawings.

To demonstrate the relatively poor storage stability of compositions containing a cycloaliphatic epoxide reactant, mixture III of Sample B was stored under ambient conditions for 44 days prior to being combined with 10% by weight of a mixture IV containing 36 parts of the epoxide, 64 parts of ground silica and 0.3 part of aluminum benzoate. This sample (D) had an epoxide/organosilicon weight ratio of 2.64 and was nonthixotropic. By comparison, Sample B, which had an epoxide/organosilicon weight ratio of 2.65 and was prepared on the same day as mixtures III and IV of sample B, was found to have an acceptable degree of thixotropy for a coating material.

EXAMPLE 3

This example demonstrates the efficacy of calcium stearate as a viscosity stabilizer for compositions containing a cycloaliphatic epoxide reactant. The compositions were prepared by combining 2 mixtures (V and VI) containing the same epoxide, siloxanes 1 and 2, fused silica and catalyst described in the preceding Example 2. Mixture V contained 31 parts of epoxide, 68.2 parts of fused silica, 0.5 part of siloxane 2 and 0.3 part of calcium stearate. Mixture VI contained 32 parts of the siloxane 1, 67.9 parts of fused silica and 0.1 part of catalyst. The two mixtures were combined in weight ratios (V/VI) of 1/1, 2/1 and 3/1. Part V was prepared 29 days before it was combined with part VI to form the 2/1 composition and part VI was prepared 52 days prior to formation of the 2/1 composition. Part V was stored for 41 days and part VI for 64 days before being combined to form the 1/1 and 3/1 weight ratio compositions. The 1/1 weight ratio mixture was sufficiently thixotropic both at ambient temperature and at 175° C. to form an acceptable cured coating over the bonding pad area of the board. The 2/1 weight ratio composition was thixotropic at ambient temperature, exhibited some flow at the curing temperature of 150° C., but still covered the bonding pad area in an acceptable manner. The 3/1 weight ratio composition flowed sufficiently beyond the bonding pad area at room temperature to be rated nonthixotropic. The coatings were evaluated using the procedure described in Example 1.

For purposes of comparison, a composition was prepared using a 2/1 weight ratio mixture of the aforementioned part VI and a mixture (VII) which was substantially identical in composition to the foregoing part V, except that it did not contain any calcium stearate. Parts VI and VII were each stored for 22 days before being combined to form a coating composition that flowed at room temperature after being applied to a printed circuit board. This composition was rated nonthixotropic at room temperature.

The efficacy of calcium stearate as a viscosity stabilizer for a mixture of a cycloaliphatic epoxide and ground, fused silica was demonstrated by preparing two mixtures (A and B). Mixture A contained 32% of the aforementioned cycloaliphatic epoxide and 68% of ground fused silica. Both of these materials are described in the preceeding Example 1. Mixture B contained 32% of the same cycloaliphatic epoxide, 67.95% of ground, fused silica and 0.05% of calcium stearate.

The initial viscosities of mixtures A and B were 204 and 265 Pa·s, respectively. After being stored for 40 days under ambient conditions, the viscosity of mixture A had not changed significantly and the viscosity of mixture B decreased to 170 Pa·s. After 20 weeks the viscosity of mixture A had increased to 450 Pa·s and the viscosity of mixture B had returned to its initial value. The addition of calcium stearate inhibited the nearly two-fold increase in viscosity exhibited by the control (mixture A).

EXAMPLE 4

This example demonstrates the variation in thixotropy that can be achieved in compositions containing a polyorganosiloxane resin as the organosilicon reactant in combination with a cycloaliphatic epoxide reactant. The epoxide reactant was identical to the one employed in the preceding Examples 2 and 3. The organosilicon resin was a cohydrolysis product containing 45 mol % $CH_3SiO_{3/2}$ units, 40 mol % $\phi SiO_{3/2}$ units, 5 mol % $\phi CH_3SiO$ units, 10 mol % $\phi_2 SiO$ units, where $\phi$ represents phenyl, and from 5 to 6% by weight of silicon-bonded hydroxyl groups.

Two coating compositions were prepared by combining ten parts of a first mixture (VIII) with one part of a second mixture (IX). The compositions of these mixtures and the weight ratio of epoxide to organosilicon reactants are listed in the following Table 2. The coatings formed using these compositions were evaluated as described in Example 1.

The siloxane listed in Table 2 was the same polymethylhydrogensiloxane used in Example 2. The fused, ground silica, silane, fume silica and catalyst are identical to the materials employed in Example 2. Both samples cured after being exposed to a temperature of 150° C. for half an hour.

TABLE 2

| Ingredient | Parts Sample C (Invention) | Sample B (Comparison) |
|---|---|---|
| Mixture VIII (10 parts) | | |
| Epoxide | 35.9 | 36.0 |
| Organosilicon Resin | 9.0 | 4.0 |
| Siloxane | 0.28 | 0.25 |
| Fused Silica | 54.0 | 59.0 |
| Silane | 0.11 | 0.15 |
| Fume Silica | 0.75 | 0.75 |
| Mixture IX (1 part) | | |
| Epoxide | 34.2 | 39.5 |
| Fused Silica | 63.4 | 59.3 |
| Silane | 0.13 | 0.15 |
| Catalyst | 2.34 | 1.09 |
| Epoxide/Organosilicon Weight Ratio | 4.4 | 10 |
| Thixotropy | Acceptable | Too High (Insufficient Flow) |

Sample C, which is within the scope of the present invention, was thixotropic and formed an acceptable mound when extruded onto a printed circuit board. By comparison, Sample D contained a weight ratio of epoxide to organosilicon reactant that is above the limit of the present invention, was too high in viscosity and did not flow sufficiently to cover the entire bonding pad area of the printed circuit board. The cured coating resembled the one depicted in FIG. 2 of the accompanying drawings.

EXAMPLE 5

This example discloses coating compositions containing a combination of a bisphenol A diglycidyl ether and an epoxidized cresol novolak resin as the epoxide reactant. The coating compositions were prepared by combining two mixtures (X and XI) to achieve weight ratios of total epoxide reactant to organosilicon reactant of 1.4, 2.8 and 4.2, respectively. Mixture X contained 12.6 parts of an epoxidized cresol novolak resin (ECN-1280 from Ciba-Geigy Corporation), 29.4 parts of a modified diglycidyl ether of bisphenol A (Epi-Rez ® 50834 from Celanese Corporation), 57.5 parts of the same ground, fused silica and 0.5 part of the same polyorganohydrogensiloxane employed in Example 2. Mixture XI contained 30 parts of a hydroxyl endblocked polymethylphenylsiloxane, 69.3 parts of ground, fused silica and 0.8 part of aluminum benzoate as a catalyst. The polymethylphenylsiloxane and ground, fused silica were the same as described in the preceding Example 1.

In this instance, the thixotropy of the coating composition was determined by extruding equal weights of coating compositions onto a glass microscope slide, curing the resultant mound at a temperature of 125° C. for one hour and measuring the height of the cured mound of material. The results of this evaluation were as follows:

| Epoxide/Organosilicon Weight Ratio | Height of Cured Material (mm.) |
|---|---|
| 1/1 | 3.56 |
| 2/1 | 3.38 |
| 3/1 | 3.05 |

The foregoing data demonstrate the variation in thixotropy that can be achieved by varying the weight ratio of epoxide to organosilicon reactant within the limits of this invention. Neither mixture (X or XI) employed to prepare the foregoing compositions exhibited levels of thixotropy as high as those of the three compositions.

EXAMPLE 6

This example demonstrates the relatively broad range over which compositions containing a diglycidyl ether of bisphenol A and a cycloaliphatic epoxide in combination with a polyorganosiloxane resin exhibit thixotropy.

The two compositions evaluated were prepared by combining two mixtures (XII and XIII) in weight ratios of 1:1 and 3:1. The ingredients present in each of the mixtures, expressed as parts by weight, were as follows:

| | Mixture XII | Mixture XIII |
|---|---|---|
| Epoxide 1 | 32.8 | 0 |
| Epoxide 2 | 6.25 | 35.0 |
| Polyorganosiloxane resin | 9.77 | 0 |
| Silane | 0.2 | 0.2 |
| Ground silica | 50.0 | 63.4 |
| Fume silica | 0.73 | 0.75 |
| Polymethylhydrogensiloxane | 0.24 | 0.25 |
| Aluminum benzoate | 0 | 0.4 |

Epoxide 1 is a diglycidyl ether of bisphenol A available as DER-332 from the Dow Chemical Company. Epoxide 2 is the cycloaliphatic epoxide compound described in the preceding Example 2, and the silane, ground, fused silica, fume silica, and polymethylhydrogensiloxane are the same ingredients employed in Example 2.

Both of the compositions were sufficiently thixotropic to form acceptable coatings when extruded on to a bonding pad area of a printed circuit board. The weight ratio of epoxide to organosilicon reactants in the 1:1 weight ratio mixture of XI and XIII was 7.58. The epoxide to organosilicon weight ratio in the 3:1 weight ratio mixture of X and XIII was 5.19:1. Both compositions had epoxide/organosilicon values within the scope of the present invention and cured in 30 minutes at ambient temperature to form acceptable coatings on the bonding pad area. The contour of the cured coating resembled that depicted in FIG. 1 of the accompanying drawings.

That which is claimed is:

1. A curable liquid coating composition comprising a homogeneous mixture of
   (A) a polyfunctional liquid or solubilized epoxide reactant selected from the group consisting of cycloaliphatic epoxide compounds, glycidyl ethers of polyhydric phenols, epoxidized novolak resins and mixtures thereof;
   (B) a polyfunctional liquid or solubilized organosilicon reactant selected from the group consisting of silanes and polyorganosiloxanes, wherein each molecule of said organosilicon reactant contains at least two silicon-bonded groups selected from the group consisting of hydroxyl and alkoxy containing from 1 to 4 carbon atoms;
(C) an amount of filler sufficient to impart a viscosity of from 50 to 1000 Pa·s, measured at 25° C., to said composition; and
(D) a curing catalyst in an amount sufficient to promote curing of said composition;
wherein the degree of thixotropic character exhibited by said composition is a function of the weight ratio of said epoxide reactant to said organosilicon reactant, and exhibits a gradual variation from a maximum degree of thixotropic character at weight ratio value $r_1$ to a minimum degree of thixotropic character at weight ratio value $r_2$, the values represented by $r_1$ and $r_2$ being within the range of from 1:1 to 8:1, inclusive.

2. A composition according to claim 1 where the epoxide reactant is a diglycidyl ether of a dihydric phenol.

3. A composition according to claim 2 where the dihydric phenol is bisphenol A.

4. A composition according to claim 2 where the diglycidyl ether of a dihydric phenol is present in combination with an epoxidized novolak resin.

5. A composition according to claim 1 where the epoxide reactant is a cycloaliphatic epoxide of the formula

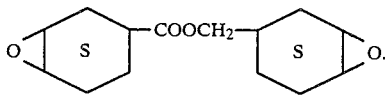

6. A composition according to claim 5 where said cycloaliphatic epoxide resin is present in combination with a diglycidyl ether of bisphenol A.

7. A composition according to claim 1 where the organosilicon reactant is a polyorganosiloxane containing repeating units of the general formula

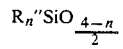

where R" is a hydrocarbyl or halohydrocarbyl radical and the value of n is from 1 to 2, inclusive.

8. A composition according to claim 7 where R" is methyl, phenyl, vinyl, 3,3,3-trifluoropropyl or a combination thereof.

9. A composition according to claim 8 where at least 50% of the R" radicals are phenyl.

10. A composition according to claim 8 where the organosilicon reactant is a polymethylphenylsiloxane.

11. A composition according to claim 7 where the organosilicon reactant is a polyorganosiloxane resin containing $\phi SiO_{3/2}$, $\phi_2 SiO$, $CH_3\phi SiO$ and $CH_3 SiO_{3/2}$ units, where $\phi$ represents phenyl.

12. A composition according to claim 1 where said composition includes from 0.005 to 0.5%, based on the combined weight of epoxide and organosilicon reactants of a silane or siloxane containing at least one silicon-bonded hydrogen atom per molecule.

13. A composition according to claim 1 where the epoxide reactant is a diglycidyl ether of bisphenol A or

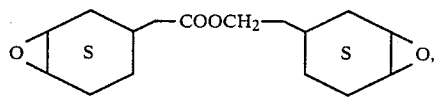

the organosilicon reactant is a hydroxyl endblocked polymethylphenylsiloxane and the weight ratios of epoxide to organosilicon reactant represented by $r_1$ and $r_2$ are 1:1 and 3:1, respectively.

14. A composition according to claim 11 where the epoxide reactant is a diglycidyl ether of bisphenol A in combination with

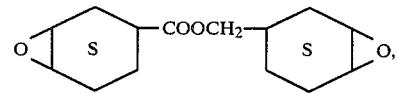

and the weight ratio of epoxide reactant to organosilicon reactant represented by $r_1$ and $r_2$ are 5:1 and 8:1, respectively.

15. A composition according to claim 1 where the epoxide reactant is a cycloaliphatic epoxide compound and the composition contains from 0.01 to about 1%, based on the weight of said composition, of a viscosity stabilizer comprising an alkaline earth metal salt of an aliphatic carboxylic acid containing from 10 to 20 carbon atoms.

16. A composition according to claim 15 where said salt is calcium stearate.

17. A composition according to claim 1 where said filler is a ground fused silica and is present at a concentration of from 50 to 75%, based on the weight of said composition.

18. A composition according to claim 1 where the curing catalyst is an aluminum compound selected from the group consisting of alkoxides, carboxylates, and reaction products of (1) said alkoxides or carboxylates with (2) compounds containing silicon-bonded hydroxyl groups, silicon-bonded alkoxy groups or silicon-bonded halogen atoms.

19. A composition according to claim 18 where said curing catalyst is an aluminum carboxylate.

20. A composition according to claim 19 where said aluminum carboxylate is aluminum benzoate.

21. A composition according to claim 18 where the concentration of curing catalyst is from 0.05 to 5%, based on the combined weight of epoxide reactant and organosilicon reactant.

22. A composition according to claim 1 where said composition contains up to 20% by weight of a monofunctional epoxide compound as a reactive diluent.

23. A composition according to claim 1 where said composition contains up to 20% by weight of a nonreactive solvent.

24. A composition according to claim 1 where the composition is cured at a temperature of from ambient to 200° C.

25. A curable liquid coating composition, said composition being a homogeneous product obtained by mixing together
(A) a polyfunctional liquid or solubilized epoxide reactant selected from the group consisting of cycloaliphatic epoxide compounds, glycidyl ethers of polyhydric phenols, epoxidized novolak resins and mixtures thereof;

(B) a polyfunctional liquid or solubilized organosilicon reactant selected from the group consisting of silanes and polyorganosiloxanes, wherein each molecule of said organosilicon reactant contains at least two silicon-bonded groups selected from the group consisting of hydroxyl and alkoxy containing from 1 to 4 carbon atoms;

(C) an amount of filler sufficient to impart a viscosity of from 50 to 1000 Pa·s, measured at 25° C., to said composition; and (D) a curing catalyst in an amount sufficient to promote curing of said composition;

wherein the degree of thixotropic character exhibited by said composition is a function of the weight ratio of said epoxide reactant to said organosilicon reactant, and exhibits a gradual variation from a maximum degree of thixotropic character at weight ratio value $r_1$ to a minimum degree of thixotropic character at weight ratio value $r_2$, the values represented by $r_1$ and $r_2$ being within the range of from 1:1 to 8:1, inclusive.

26. A method for coating an electronic device that is bonded to a printed circuit board, said method consisting essentially of (I) applying over the exposed surfaces of said device a curable, thixotropic composition comprising (A) a polyfunctional liquid or solubilized epoxide reactant selected from the group consisting of cycloaliphatic epoxide compounds, glycidyl ethers of polyhydric phenols, epoxidized novolak resins and mixtures thereof;

(B) a polyfunctional liquid or solubilized organosilicon reactant selected from the group consisting of silanes and polyorganosiloxanes, wherein each molecule of said organosilicon reactant contains at least two silicon-bonded groups selected from the group consisting of hydroxyl and alkoxy containing from 1 to 4 carbon atoms;

(C) an amount of filler sufficient to impart a viscosity of from 50 to 1000 Pa·s, measured at 25° C., to said composition; and (D) a curing catalyst in an amount sufficient to promote curing of said composition;

wherein the degree of thixotropic character exhibited by said composition is a function of the weight ratio of said epoxide reactant to said organosilicon reactant, and exhibits a gradual variation from a maximum degree of thixotropic character at weight ratio value $r_1$ to a minimum degree of thixotropic character at weight ratio value $r_2$, the values represented by $r_1$ and $r_2$ being within the range of from 1:1 to 8:1, inclusive; and (II) curing said composition to form a solid material.

* * * * *

UNITED STATES PATENT AND TRADEMARK OFFICE
CERTIFICATE OF CORRECTION

PATENT NO. : 4,518,631

DATED : 5-21-85

INVENTOR(S) : Robert Clayton Antonen

It is certified that error appears in the above-identified patent and that said Letters Patent is hereby corrected as shown below:

Column 2, line 68 - Delete period (.) following "pad" and insert a period (.) immediately following "(3)".

Column 13, line 13 - Delete "Sample B" and substitute therefor --- Sample D ---.

Column 14, line 1 - Delete "Epoxide/Organosilicon" and substitute therefor --- X/XI ---.

Signed and Sealed this

Fifth Day of November 1985

[SEAL]

Attest:

DONALD J. QUIGG

Attesting Officer

Commissioner of Patents and Trademarks